(12) United States Patent
Nishio et al.

(10) Patent No.: US 6,862,804 B2
(45) Date of Patent: Mar. 8, 2005

(54) METHOD OF MOUNTING CAMERA MODULE ON WIRING BOARD

(75) Inventors: Atsushi Nishio, Ibaraki (JP); Takashi Kawasaki, Ibaraki (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 10/627,918

(22) Filed: Jul. 28, 2003

(65) Prior Publication Data

US 2004/0068868 A1 Apr. 15, 2004

(30) Foreign Application Priority Data

Jul. 29, 2002 (JP) .................................. P.2002-220085

(51) Int. Cl.⁷ ................................................. H05K 3/34
(52) U.S. Cl. .......................... 29/840; 29/740; 29/832; 29/833; 29/834
(58) Field of Search .......................... 29/740, 832, 833, 29/834, 840; 385/14

(56) References Cited

U.S. PATENT DOCUMENTS

| | | | |
|---|---|---|---|
| 5,046,953 A | * | 9/1991 | Shreeve et al. ............... 439/66 |
| 5,046,954 A | | 9/1991 | Schmedding |
| 5,302,778 A | * | 4/1994 | Maurinus .................... 174/52.4 |
| 5,358,412 A | * | 10/1994 | Maurinus et al. ............. 439/66 |
| 5,847,887 A | * | 12/1998 | Ogura et al. ................. 359/822 |
| 6,470,103 B2 | * | 10/2002 | Watanabe ..................... 385/14 |
| 6,566,669 B2 | * | 5/2003 | Watanabe ................. 250/559.3 |
| 6,583,402 B1 | * | 6/2003 | Watanabe ................... 250/215 |
| 2001/0027873 A1 | | 10/2001 | Miyake |
| 2001/0055073 A1 | | 12/2001 | Shinomiya |

FOREIGN PATENT DOCUMENTS

| | | |
|---|---|---|
| EP | 1 148 716 | 10/2001 |
| EP | 1 213 924 | 6/2002 |

* cited by examiner

Primary Examiner—Carl J. Arbes
(74) Attorney, Agent, or Firm—Whitham, Curtis & Christofferson, PC

(57) ABSTRACT

A wiring board provided with a first terminal, a connector provided with a second terminal, and a camera module provided with a third terminal are provided. The first terminal and the second terminal are soldered to mount the connector on the wiring board. The camera module is mounted on the connector to electrically connect the second terminal with the third terminal.

7 Claims, 5 Drawing Sheets

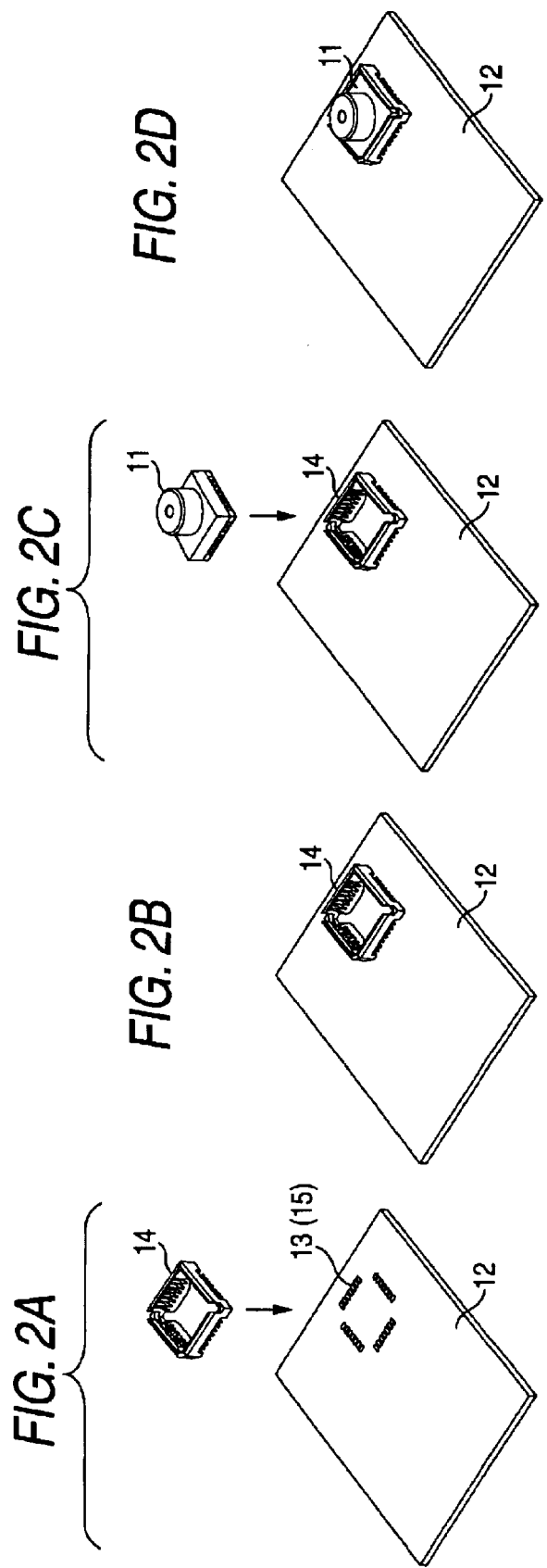

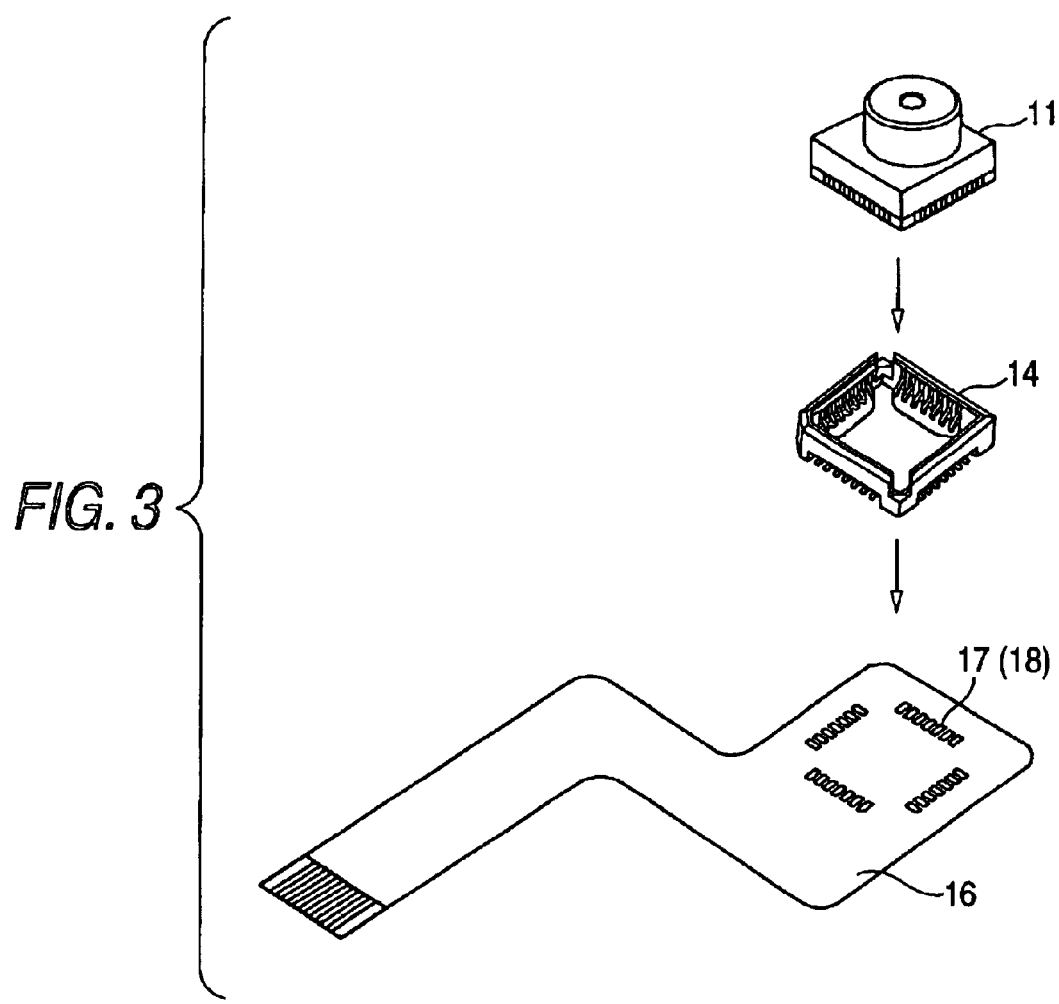

METHOD OF MOUNTING CAMERA MODULE ON WIRING BOARD

BACKGROUND OF THE INVENTION

This invention relates to a method of mounting a camera module (particularly provided with a cellular phone) on a wiring board (circuit board).

Examples of the related-art method of mounting a camera module on a wiring board will be described with reference to FIGS. 4A through 5B.

FIGS. 4A and 4B show a method of mounting a camera module 1 on a printed wiring board (PWB) 2. As shown in FIG. 4A, terminals 3 of a printed circuit (not shown) are provided in an exposed manner on the printed wiring board 2. The camera module 1 is placed on the terminals 3, so that terminals 4 of the camera module 1 are connected respectively to the terminals 3 by solder 5 as shown in FIG. 4B.

Since the camera module 1 is not sufficiently heat-resistant to withstand a furnace temperature of about 230 to 240° C. used in a reflowing process, it is impossible to perform the soldering with the reflowing process. Therefore, the mounting operation of the camera module 1 is manually executed with a manual soldering.

FIGS. 5A and 5B show a method of mounting a camera module 1 on a flexible printed circuit (FPC) 6. As shown in FIG. 5A, terminals 7 of a printed circuit (not shown) are provided in an exposed manner on the flexible printed circuit 6. The camera module 1 is placed on the terminals 7, so that the terminals 4 of the camera module 1 are connected respectively to the terminals 7 by solder 8 as shown in FIG. 5B.

Also in this case, since it is impossible to perform the reflowing process due to the same reason as described above, the mounting operation is manually executed with the manual soldering.

Consequently, productivity (working efficiency) is low, and camera placement accuracy is poor.

SUMMARY OF THE INVENTION

It is therefore an object of the invention to provide a method of mounting a camera module on a wiring board, in which the working efficiency and the mounting precision are enhanced.

In order to achieve the above object, according to the invention, there is provided a mounting method, comprising steps of:

providing a wiring board provided with a first terminal;

providing a connector provided with a second terminal;

providing a camera module provided with a third terminal;

soldering the first terminal and the second terminal to mount the connector on the wiring board; and mounting the camera module on the connector to electrically connect the second terminal with the third terminal.

Preferably, the soldering step is performed in a non-manual manner. Here, it is further preferable that the soldering step is performed with a reflowing process.

Preferably, the wiring board is a printed wiring board. Here, it is further preferable that the wiring board is a flexible printed board.

With the above configuration, since the automatic mounting such as the reflowing process can be adopted in the soldering step, as compared with the manual soldering, the working efficiency can be greatly enhanced, and besides the mounting precision can be enhanced.

Preferably, the camera module is detachably mounted on the connector.

With such a configuration, the camera module can be easily exchanged when the camera module is found to be defective.

BRIEF DESCRIPTION OF THE DRAWINGS

The above objects and advantages of the present invention will become more apparent by describing in detail preferred exemplary embodiments thereof with reference to the accompanying drawings, wherein:

FIGS. 2A to 2D are perspective views showing each process of the mounting method;

FIG. 3 is a perspective view showing a mounting method of a camera module according to a second embodiment of the invention;

DETAILED DESCRIPTION OF THE INVENTION

Figure 1:
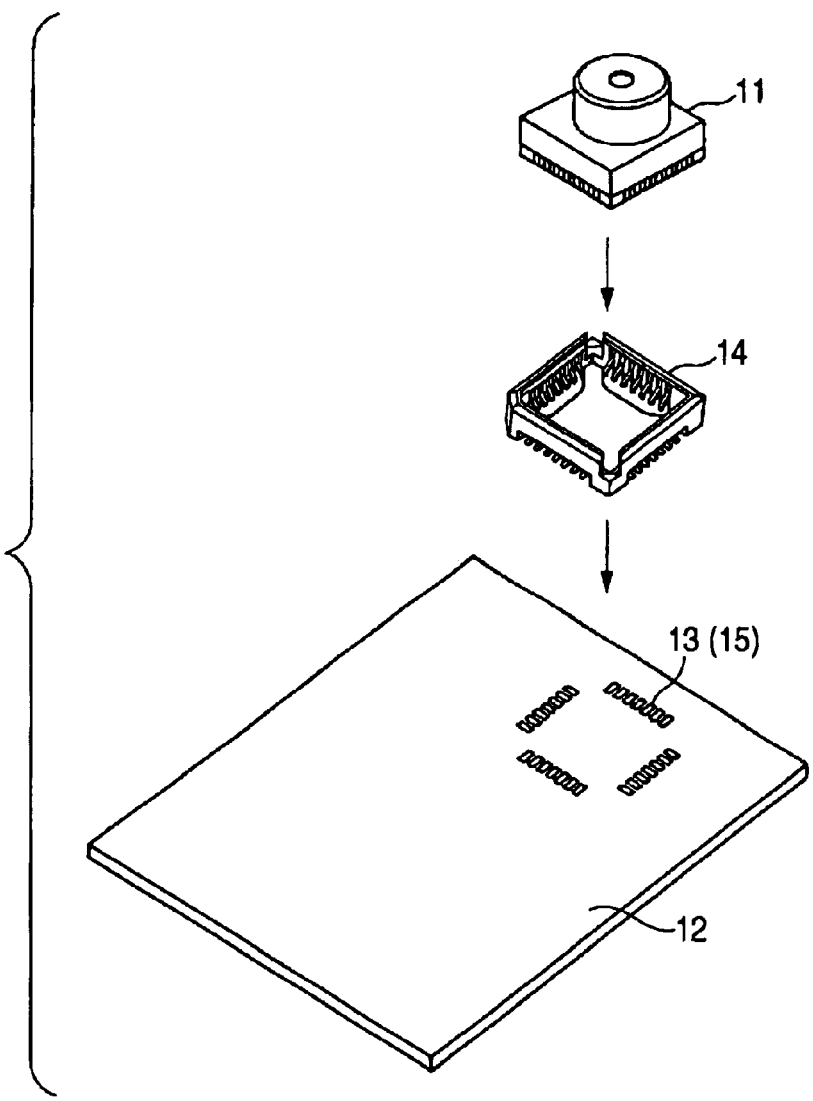
FIG. 1 is a perspective view showing a mounting method of a camera module according to a first embodiment of the invention.
Figure 4A:
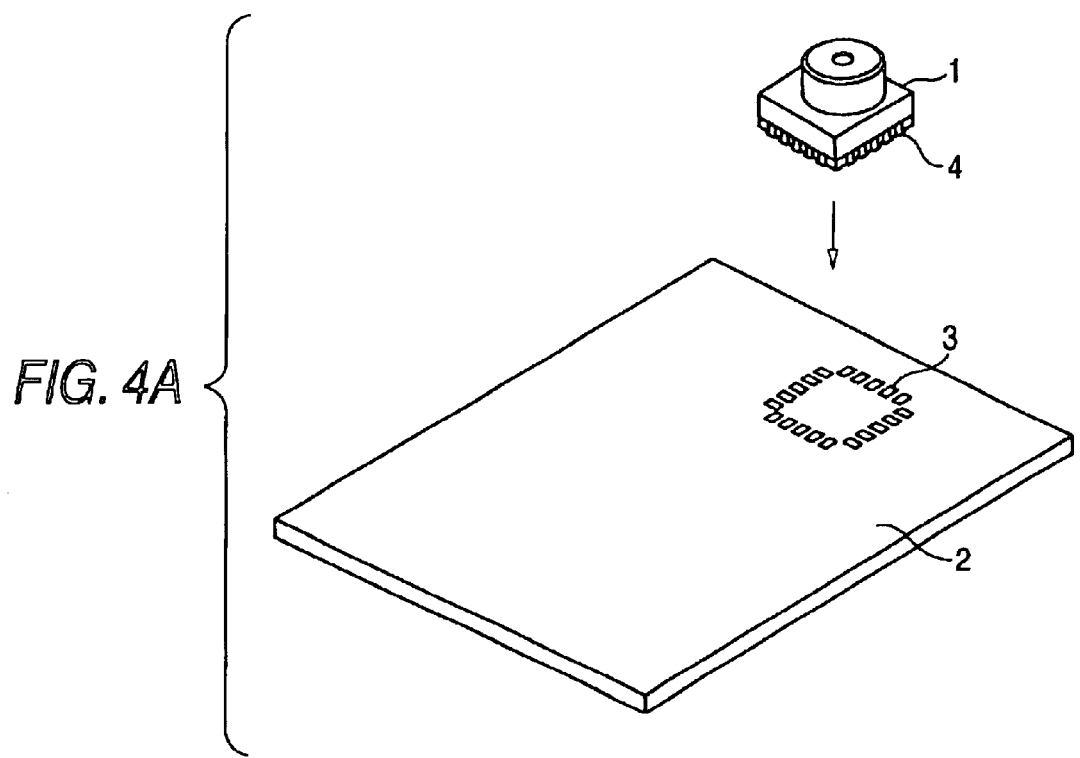
FIGS. 4A and 4B are perspective views showing a first related-art method of a camera module.
Figure 4B:
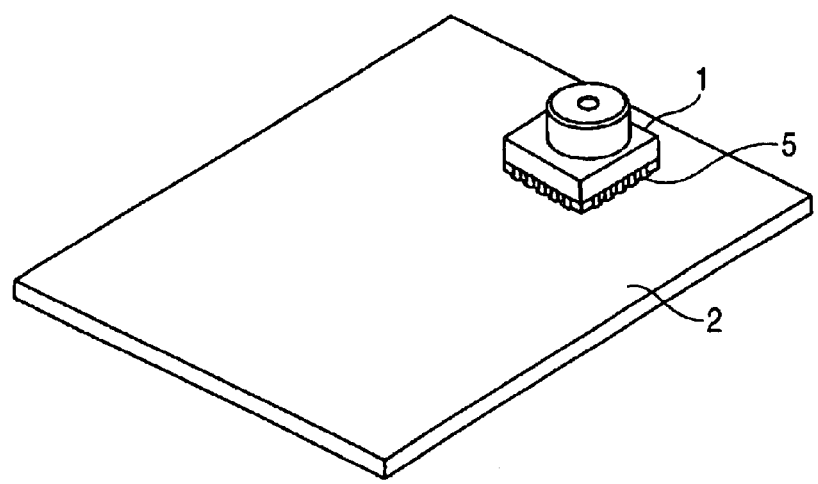
Figure 5A:
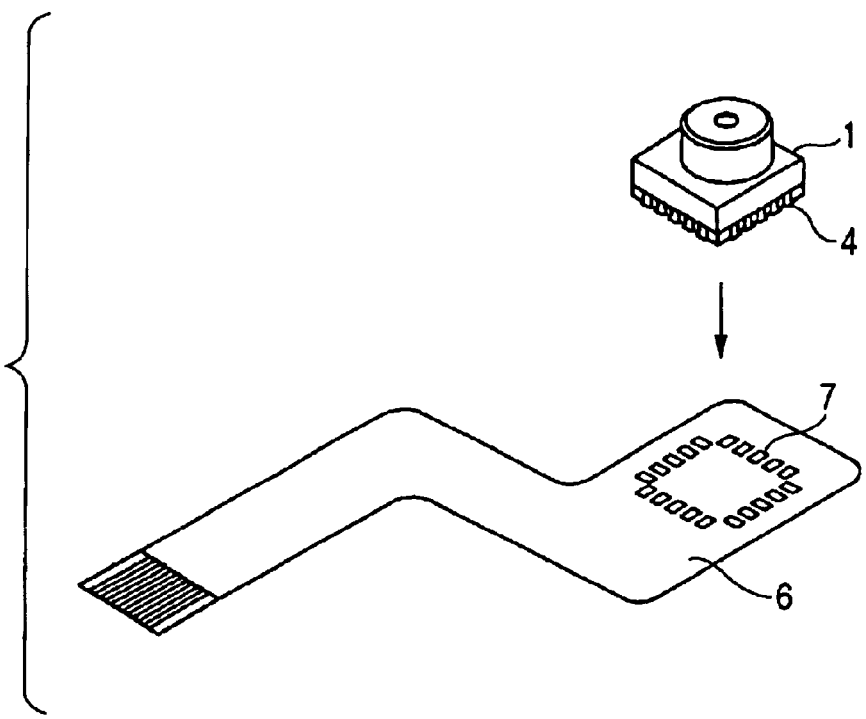
FIGS. 5A and 5B are perspective views showing a second related-art method of a camera module.
Figure 5B:
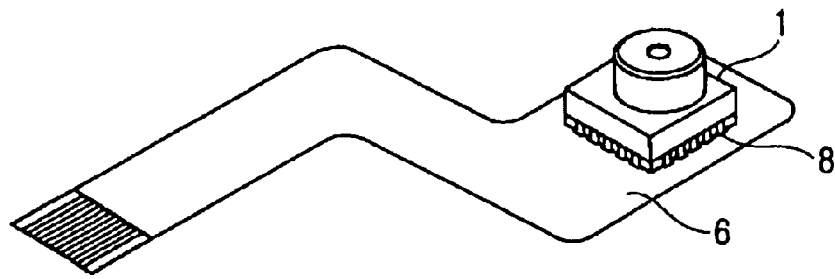

As a first embodiment of the invention, FIG. 1 shows a method of mounting a camera module 11 on a printed wiring board 12. Terminals 13 of a printed circuit (not shown) are provided in an exposed manner on the printed wiring board 12, and a connector 14 is fixedly secured onto the terminals 13 by soldering. The camera module 11 is then fitted into the connector 14, thereby mounting the camera module 11 on the printed wiring board 12.

FIGS. 2A to 2D show each process of mounting the camera module 11 on the printed wiring board 12. In FIG. 2A, solder 15 is placed on the exposed terminals 13 provided on the printed wiring board 12. The connector 14 is placed on the terminals 13 through the solder 15, and the automatic mounting of this connector is performed with a reflowing process as shown in FIG. 2B. Then, as shown in FIG. 2C, the camera module 11 is fitted into the connector 14, so that the camera module 11 is mounted on the printed wiring board 12 as shown in FIG. 2D.

In this embodiment, since the camera module 11 is mounted on the printed wiring board 12 through the connector 14, the automatic mounting using the reflowing process can be adopted when mounting the connector 14 on the printed wiring board 12. Therefore, as compared with the manual mounting, the working efficiency can be greatly enhanced, and besides the mounting precision can be enhanced.

In addition, since the camera module 11 is detachably fitted into the connector 14, if the camera module 11 is found to be defective in an inspection process or the like, this camera module can be easily exchanged.

As a second embodiment of the invention, FIG. 3 shows a method of mounting a camera module 11 on a flexible printed circuit 16. In this embodiment, solder 18 is first placed on terminals 17 of a not-shown printed circuit provided in an exposed manner on the flexible printed circuit 16. The connector 14 is then placed on the terminals 17 through the solder 18, and the automatic mounting of this connector is performed with the reflowing process. Finally, the camera module 11 is fitted into the connector 14, thereby mounting the camera module 11 on the flexible printed circuit 16. The flexible printed circuit 16 has sufficient heat-resistance to withstand the reflowing process.

Also in this embodiment, the same advantages as explained with the first embodiment can be attained.

In the present invention, various modifications can be made without departing from the spirits of the invention, and such modifications fall within the scope of the invention.

For example, although the above explanation has been made for the case of mounting a camera module, the mounting method of the invention can be used for mounting, another parts or module such as a Bluetooth module, instead of the camera module.

What is claimed is:

1. A mounting method, comprising the steps of:

providing a wiring board provided with a first terminal;

providing a connector provided with a second terminal;

providing a camera module provided with a camera and a third terminal;

soldering the first terminal and the second terminal to mount the connector on the wiring board; and mounting the camera module on the connector to electrically connect the second terminal with the third terminal.

2. The mounting method as set forth in claim 1, wherein the soldering step is performed in a non-manual maimer.

3. The mounting method as set forth in claim 2, wherein the soldering step is performed with a reflowing process.

4. The mounting method as set forth in claim 1, wherein the wiring board is a printed wiring board.

5. The mounting method as set forth in claim 1, wherein the wiring board is a flexible printed board.

6. The mounting method as set forth in claim 1, wherein the camera module is detachably mounted on the connector.

7. The mounting method as set forth in claim 1, wherein the camera is mounted so as to face away from the wiring board.

* * * * *